United States Patent
Umehara et al.

[11] Patent Number: 5,882,956
[45] Date of Patent: Mar. 16, 1999

[54] PROCESS FOR PRODUCING SEMICONDUCTOR DEVICE

[75] Inventors: Norito Umehara; Masazumi Amagai, both of Hayami-gun; Mamoru Kobayashi, Yoshikawa; Kazuyoshi Ebe, Minamisaitama-gun, all of Japan

[73] Assignees: Texas Instruments Japan Ltd.; Lintec Corporation, both of Japan

[21] Appl. No.: 786,659

[22] Filed: Jan. 21, 1997

[30] Foreign Application Priority Data

Jan. 22, 1996 [JP] Japan .................................. 8-008049

[51] Int. Cl.⁶ .................................................. H01L 21/208
[52] U.S. Cl. ........................... 438/114; 498/114; 498/464; 498/465
[58] Field of Search ...................... 498/113, 114, 498/464, 465

[56] References Cited

U.S. PATENT DOCUMENTS

| | | | |
|---|---|---|---|
| 4,687,693 | 8/1987 | Shayon et al. | 428/148 |
| 4,793,883 | 12/1988 | Sheyon et al. | 156/235 |
| 5,110,388 | 5/1992 | Komyama et al. | 156/229 |
| 5,118,567 | 6/1992 | Komiyama et al. | 428/345 |
| 5,316,853 | 5/1994 | Shibata et al. | 428/416 |
| 5,411,921 | 5/1995 | Negoro | 438/118 |
| 5,527,998 | 6/1996 | Anderson et al. | 174/255 |
| 5,692,297 | 12/1997 | Noda | 29/845 |
| 5,705,016 | 1/1998 | Senoo et al. | 156/289 |

FOREIGN PATENT DOCUMENTS

| | | |
|---|---|---|
| 622833 | 11/1994 | European Pat. Off. |
| 5191918 | 7/1993 | Japan |
| 5191919 | 7/1993 | Japan |

*Primary Examiner*—David Graybill
*Assistant Examiner*—Alonzo Chambliss
*Attorney, Agent, or Firm*—Webb Ziesenheim Bruening Logsdon Orkin & Hanson, P.C.

[57] ABSTRACT

A process for manufacturing a wafer dicing/bonding sheet of the present invention comprises a soft film, a pressure sensitive adhesive layer formed on the soft film, a processing film for polyimide type resin composed of a heat resistant resin which has been formed on the pressure sensitive adhesive layer and a polyimide adhesive layer formed on the processing film. It is preferred that the processing film be a polyethylene naphthalate film whose surface has been subjected to an alkyd release treatment. The present invention facilitates expansion to be conducted after the wafer dicing.

9 Claims, 2 Drawing Sheets

PROCESS FOR PRODUCING SEMICONDUCTOR DEVICE

FIELD OF THE INVENTION

The present invention relates to a wafer bonding sheet for use in the process in which a plurality of semiconducting integrated circuits formed on a semiconductor wafer, for example, a silicon wafer are diced into individual separate semiconducting integrated circuits, i.e., IC chips (also referred to as "chips" or "dies") and the IC chips are mounted on, for example, a lead frame for package and relates to a process for producing a semiconductor device which includes the above process.

BACKGROUND OF THE INVENTION

A semiconductor wafer of, for example, silicon or gallium arsenide is produced in the form of a large diameter. This wafer is cut and separated (diced) into IC chips and is subjected to the subsequent die bonding step (also referred to as "mounting step") in which the IC chips are mounted on a lead frame for package. In this process, the semiconductor wafer undergoes dicing, cleaning, drying, expansion and pickup steps in the state of being attached to an adhesive sheet, and transferred to the subsequent die bonding step.

Adhesive sheets which are intended for use in the processing steps of wafers, from the dicing step up to the pickup step, are desired to have an adhesive force sufficient to retain wafers and/or chips thereon in the course from the dicing step up to the expanding step, but in the pickup step, they are desired to only retain an adhesion force of such an extent that no adhesive remains on the picked-up wafer and/or chips.

In the die bonding step, the picked up IC chips are fixed on IC chip mount zones (simply, mount zones) of a lead frame by means of an IC chip bonding adhesive such as an epoxy adhesive, a polyimide adhesive or a silver paste which is fed in the form of a viscous liquid to form an adhesive coat on the mount zones, followed by being subjected to the wire bonding step and resin mold step, thereby obtaining a semiconductor device. However, when the size of each of the IC chips is very small, it is difficult to uniformly apply an appropriate amount of adhesive with the use of the above liquid adhesive, so that the adhesive outflows the IC chips. On the other hand, when the size of each of the IC chips is very large, the use of the above liquid adhesive has encountered the problems such that the amount of the adhesive is short to thereby disenable bonding which ensures a satisfactory bonding strength. In recent years, the degree of integration of each semiconductor chip tends to increase, so that the chip tends to have an enlarged surface area and the wiring tends to become fine and a multilayer. On the other hand, the package in which the chips are accommodated tends to become miniaturized and thinner so that the mount on a printed wiring board can be conducted in high density. The obtained thin package with an enlarged surface area has encountered the problems such that the thermal shock and hot moisture resistances are poor and the package is likely to crack in the surface mount step, as compared with that of the prior art.

A film adhesive of a polyimide type resin having excellent heat resistance has been proposed for use in the bonding of IC chips to the lead frame. Further, it has been proposed to employ a dicing sheet comprising a substrate film and, detachably laminated thereto, such an adhesive for bonding of IC chips, which dicing sheet can simultaneously be used in dicing and die bonding.

However, the use of the polyimide adhesive in the above dicing sheet has encountered the limitation in employable substrate film because the solvent component of the polyimide adhesive has high boiling point and high polarity. Further, the above substrate film is generally so hard that the expansion thereof is not easy. Thus, it is difficult to enlarge the IC chip spacing with the result that erroneous operation is occasionally caused in the pickup of IC chips.

OBJECT OF THE INVENTION

The present invention has been made in the above situation of the prior art. It is an object of the present invention to facilitate the expansion of the wafer dicing/bonding sheet in which a polyimide adhesive is used. Another object of the present invention is to provide a process for producing a semiconductor device in which package cracking hardly ever occurs.

SUMMARY OF THE INVENTION

The wafer dicing/bonding sheet of the present invention is composed of
  a sheet for expanding process comprising a soft film and, formed thereon, a pressure sensitive adhesive layer, and
  a polyimide bonding sheet comprising a processing film for polyimide type resin and, formed thereon, a polyimide adhesive layer.

The first process for producing a semiconductor device according to the present invention comprises the steps of:
  conducting a thermocompression bonding of a semiconductor wafer to a polyimide adhesive layer of the wafer dicing/bonding sheet which is composed of
    a sheet for expanding process comprising a soft film and, formed thereon, a pressure sensitive adhesive layer, and a polyimide bonding sheet comprising a processing film for polyimide type resin and, formed thereon, the polyimide adhesive layer;
  dicing the semiconductor wafer into IC chips;
  expanding the wafer dicing/bonding sheet so as to enlarge IC chip spacings;
  peeling from the processing film for polyimide type resin the IC chips having the polyimide adhesive layer sticking thereto on their backs; and
  placing the IC chips on a lead frame in a manner such that the polyimide adhesive layer is interposed between the IC chips and the lead frame to thereby bond the IC chips to the lead frame.

The second process for producing a semiconductor device according to the present invention comprises the steps of:
  conducting a thermocompression bonding of a semiconductor wafer to a polyimide adhesive layer of a polyimide bonding sheet which comprises
    a processing film for polyimide type resin and, formed thereon, the polyimide adhesive layer;
  attaching a sheet for expanding process comprising a soft film and, formed thereon, a pressure sensitive adhesive layer to the polyimide bonding sheet in a manner such that the pressure sensitive adhesive layer contacts an exposed surface of the processing film for polyimide type resin of the polyimide bonding sheet;
  dicing the semiconductor wafer into IC chips;
  expanding the sheet for expanding process so as to enlarge IC chip spacings;
  peeling from the processing film for polyimide type resin the IC chips having the polyimide adhesive layer sticking thereto on their backs; and placing the IC chips on a lead frame in a manner such that the polyimide adhesive layer is interposed between the IC chips and the lead frame to thereby bond the IC chips to the lead frame.

In the present invention as described above, it is preferred that the processing film for polyimide type resin as a constituent member of the polyimide bonding sheet be made from a resin having a melting point of 230° C. or higher, preferably, 250 to 300° C. The processing film for polyimide type resin is preferred to have a surface tension of less than 40 dyn/cm. In particular, in the present invention, it is preferred that the processing film for polyimide type resin be composed of a polyethylene naphthalate resin.

Further, in the present invention, it is preferred that the pressure sensitive adhesive layer have a surface area which can be supported by a wafer dicing ring frame and the polyimide adhesive layer have an outside diameter which is smaller than an inside diameter of the wafer dicing ring frame.

DETAILED DESCRIPTION OF THE INVENTION

The wafer dicing/bonding sheet, process for producing a semiconductor device, polyimide bonding sheet and processing film for polyimide type resin according to the present invention will be described in detail below.

Figure 1:
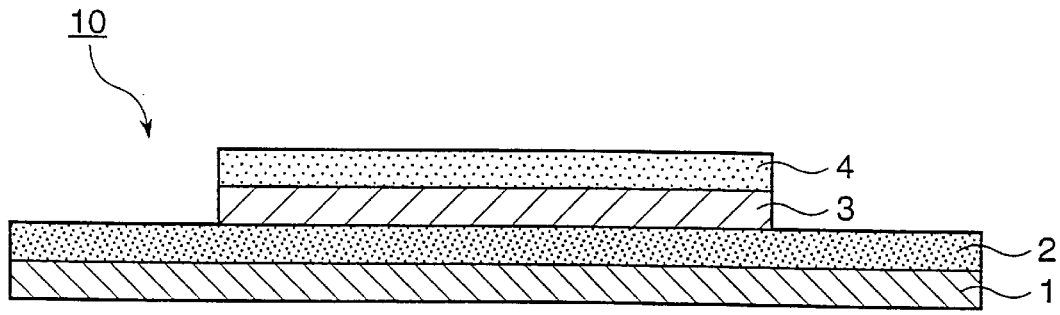
FIG. 1 is a sectional view of the wafer dicing/bonding sheet of the present invention.

Referring to FIG. 1, the wafer dicing/bonding sheet 10 of the present invention is composed of a sheet for expanding process (an expanding process sheet) 8 comprising a soft film 1 and, formed thereon, a pressure sensitive adhesive layer 2, and the polyimide bonding sheet 7 comprising a processing film for polyimide type resin 3 being formed on the pressure sensitive adhesive layer 2 and, formed thereon, a polyimide adhesive layer 4. Before the use of the wafer dicing/bonding sheet 10 of the present invention, a release film may be laminated to the upper surface thereof in order to protect the pressure sensitive adhesive layer 2 and the polyimide adhesive layer 4.

The configuration of the wafer dicing/bonding sheet of the present invention is not particularly limited, and, for example, the wafer dicing/bonding sheet may have the form of a tape or a label.

The soft film 1 as a constituent member of the sheet for expanding process 8 is composed of a resin film which is extensible in not only the direction of the length but also the direction of the width. Although various resin films are available, it is preferred that the Young's modulus thereof be not greater than $1.0 \times 10^4$ kg/cm$^2$, especially, in the range of $5.0 \times 10^1$ to $5.0 \times 10^3$ kg/cm$^2$.

Examples of such soft film 1 include a film of polyethylene, polyvinyl chloride, polybutene, polybutadiene, polyurethane, polyester, polyamide, ethylene/vinyl acetate copolymer, ethylene/(meth)acrylic acid copolymer, ethylene/methyl (meth)acrylate copolymer, ethylene/ethyl (meth)acrylate copolymer or the like. The soft film 1 may also be a laminate of at least two films selected from among the above. The thickness of the soft film 1 generally ranges from about 10 to 300 µm, preferably, from about 50 to 200 µm.

The pressure sensitive adhesive layer 2 as a constituent member of the sheet for expanding process 8 holds the processing film for polyimide type resin 3 to adhere to the soft film 1 during the dicing and pickup steps. By adjusting the surface areas of processing film for polyimide type resin 3 and polyimide adhesive layer 4 being smaller than the inside diameter of the ring frame, it is possible to detachably support the ring frame on the pressure sensitive adhesive layer 2.

The pressure sensitive adhesive layer 2 can be composed of various conventional pressure sensitive adhesives such as acrylic, rubber, polyurethane, silicone and polyester adhesives. Among them, acrylic adhesive is preferred from the viewpoint, for example, that the control of adhesion characteristics is easy.

The acrylic pressure sensitive adhesive comprises an acrylic copolymer as a principal component.

The acrylic copolymer is generally obtained by copolymerizing a (meth)acrylic ester monomer having an alkyl group of 1 to 18 carbon atoms as a main monomer with a monomer having a functional group such as hydroxyl, carboxyl or amino or other copolymerizable monomer.

Although the molecular weight of the acrylic copolymer is not particularly limited, the weight average molecular weight thereof generally ranges from $1.0 \times 10^5$ to $1.0 \times 10^6$, preferably, from $4.0 \times 10^5$ to $8.0 \times 10^5$.

The adhesive and cohesive forces of the acrylic pressure sensitive adhesive having a functional group can be controlled by adding an appropriate crosslinking agent. This crosslinking agent may be, for example, a polyvalent isocyanate compound, a polyvalent epoxy compound, a polyvalent aziridine compound, a metal chelate compound or the like.

The above component of the pressure sensitive adhesive can be used singly or the combination of two or more components. Further, additives such as a tackifier and a filler may be added to the pressure sensitive adhesive.

The thickness of the pressure sensitive adhesive layer 2 is preferred to range from 1 to 50 µm, especially, from 5 to 30 µm.

The processing film for polyimide type resin 3 as a constituent member of the polyimide bonding sheet 7 is preferably made from a heat resistant resin. The melting point of the above resin is preferably at least 230° C., still preferably, 250 to 300° C. and, yet still preferably, 260 to 280° C. The surface tension of the processing film for polyimide type resin 3 is preferred to be less than 40 dyn/cm, especially, dyn/cm. It is desired that the below described polyimide adhesive layer 4 be formed on the surface having the above surface tension. The employment of the surface tension of 30 to 40 dyn/cm ensures excellent transferability of the polyimide adhesive layer 4 from the processing film for polyimide type resin 3 and excellent chip retention at the use in dicing.

Examples of such processing film for polyimide type resin 3 include a film of polyethylene naphthalate, polyethylene terephthalate, polybutylene terephthalate, polyimide, polyether-imide, polyaramid, polyether-ketone, polyetherether-ketone, polyphenylene sulfide or the like. The processing film for polyimide type resin 3 may also be a laminate of at least two films selected from among the above or a laminate of a film selected from among the above and another film. Of them, the use of a polyethylene naphthalate film is especially preferred.

The thickness of the processing film for polyimide type resin 3 generally ranges from about 10 to 300 μm, preferably, from about 16 to 100 μm, although depending on the type of the material thereof. For realizing the above surface tension value, it is preferred to subject one side of the processing film for polyimide type resin 3 with a release treatment and dispose the polyimide adhesive layer 4 on the surface having been subjected to the release treatment.

The above release agent used in the release treatment is, for example, an alkyd, a silicone, a fluorinated, an unsaturated polyester, a polyolefin or a wax release agent. Of these, alkyd, silicone and fluorinated release agents are preferred because of their superior heat resistances. The alkyd release agent is especially preferred because its adherence to the processing film for polyimide type resin as a substrate is high and the regulation of the surface tension is easy.

In the release treatment of the surface of the processing film for polyimide type resin 3 with the use of the above release agent, the release agent as it is without the use of any solvent or after being diluted with a solvent or emulsified is applied by means of a gravure coater, a Mayor bar coater, an air knife coater, a roll coater or the like and cured at ordinary temperature or raised temperature or with electron beam radiation. Alternatively, a laminate may be formed by the use of a wet lamination, a dry lamination, a hot melt lamination, a melt extrusion lamination or a coextrusion technique.

The use of the above processing film for polyimide type resin 3 avoids the direct contact of the below described polyimide adhesive layer 4 with the pressure sensitive adhesive layer 2, so that component migration can be prevented therebetween to thereby reduce package cracking in the semiconductor device as a final product.

The polyimide type resin used in the polyimide adhesive layer 4 as a constituent member of the polyimide bonding sheet 7 includes a polyimide resin itself and a precursor of polyimide resin. The polyimide resin has an imide bond in its side chain or main chain. The precursor of polyimide resin is those giving the above polyimide resin at the final bonding stage. Examples of such polyimide type resin include a polyimide resin, a polyisoimide resin, a maleimide resin, a bismaleimide resin, a polyamide-imide resin, a polyether-imide resin and a polyimide-isoindoloquinazolinedionimide resin. These resins may be used either individually or in combination. Of them, a polyimide type resin is especially preferred.

The molecular weight of the polyimide type resin is preferred to range from 10,000 to 1,000,000, especially, from about 50,000 to 100,000.

A thermoplastic polyimide type resin having no reactive functional group and a thermosetting polyimide type resin which undergoes an imidation reaction upon heating are available and both may be used in the present invention. In the use of the thermosetting polyimide type resin, a temporary bonding is first effected with the use of the resin in a semicured stage (generally known as "B stage") and then a thermal curing is performed to thereby convert the adhesive layer into a polyimide. Thus, the bonding step is completed.

The polyimide adhesive may comprise another polymer or oligomer or a low molecular weight compound in addition to the polyimide type resin. Examples of such additives include various polymers and oligomers such as epoxy, amide, urethane, amic acid, acrylic and silicone resins and nitrogen-containing organic compounds such as triethanolamine and α, ω-bis (3-amino-propyl) polyethylene glycol ether.

A solvent which can uniformly dissolve or disperse the above components can be used in the preparation of a composition of the polyimide adhesive. This solvent is not particularly limited as long as it can uniformly dissolve or disperse the above materials, and examples of such solvents include dimethylformamide, dimethylacetamide, N-methylpyrrolidone, dimethyl sulfoxide, diethylene glycol dimethyl ether, toluene, benzene, xylene, methyl ethyl ketone, tetrahydrofuran, ethyl cellosolve, dioxane, cyclopentanone and cyclohexanone. These may be used either individually or in combination.

The thickness of the polyimide adhesive layer 4 is preferred to range from about 1 to 50 μm, especially, from about 5 to 20 μm.

The wafer dicing/bonding sheet 10 of the present invention comprises the sheet for expanding process 8 and, fixed thereto, the polyimide bonding sheet 7. Concretely, the wafer dicing/bonding sheet 10 is obtained by piling the soft film 1, pressure sensitive adhesive layer 2, processing film for polyimide type resin 3 and polyimide adhesive layer 4 one upon another in this order. Also, the wafer dicing/bonding sheet 10 can be produced by separately preparing a laminate (sheet for expanding process 8) of the soft film 1 and the pressure sensitive adhesive layer 2 and a laminate (polyimide bonding sheet 7) of the processing film for polyimide type resin 3 and the polyimide adhesive layer 4 and then piling the laminates one upon the other.

Figure 2:
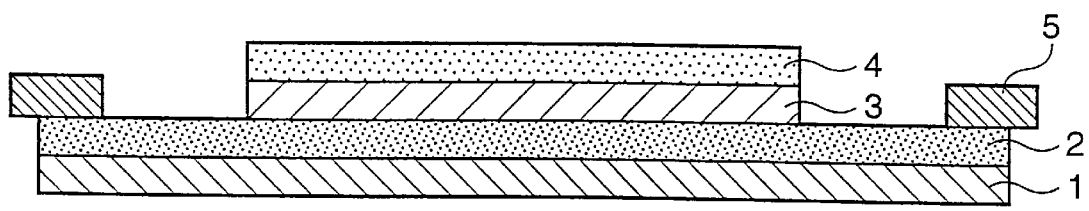
FIG. 2 shows the state of fixing the wafer dicing/bonding sheet by means of a ring frame.

In the wafer dicing/bonding sheet 10 of the present invention, it is preferred that the surface area of the pressure sensitive adhesive layer 2 be made larger than that of the processing film for polyimide type resin 3 to thereby expose part of the pressure sensitive adhesive layer 2, as shown in FIG. 1. The exposed part of the pressure sensitive adhesive layer 2 is used to bond the ring frame 5 for fixing the sheet 10 at the time of dicing, as shown in FIG. 2.

That is, in the wafer dicing/bonding sheet 10 of the present invention, it is preferred that the pressure sensitive adhesive layer 2 have a surface area which can be supported by a wafer dicing ring frame 5 and the polyimide adhesive layer 4 have an outside diameter which is smaller than an inside diameter of the wafer dicing ring frame 5. In this wafer dicing/bonding sheet 10, the outside diameter of the processing film for polyimide type resin 3 is identical with or larger than the outside diameter of the polyimide adhesive layer 4 and is smaller than the inside diameter of the ring frame.

A wafer can be bonded at an adhesive strength of, preferably, at least 100 g/25 mm and, still preferably, at least 400 g/25 mm onto the wafer dicing/bonding sheet of the present invention by a thermocompression bonding which is conducted at about 100 to 300° C., preferably, about 120 to 150° C. under a pressure of about 1 to 10 kg/cm², preferably, about 1 to 4 kg/cm².

The process for producing a semiconductor device according to the present invention will be described below.

Figure 4:
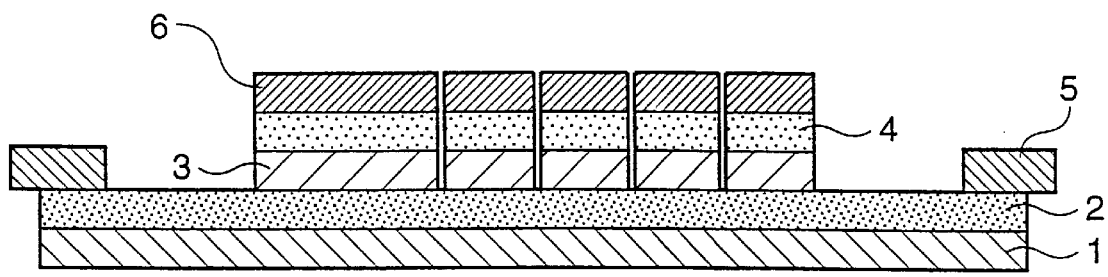
FIG. 4 shows the state of dicing the silicon wafer.
Figure 5:
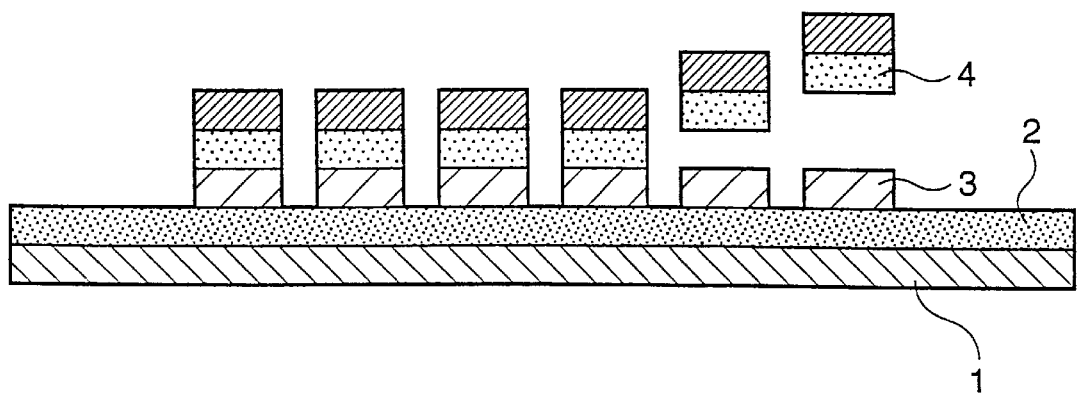
FIG. 5 shows the state of picking up the IC chips after expanding the wafer dicing/bonding sheet.

In the first process for producing a semiconductor device according to the present invention, initially, the bonding sheet 10 is fixed on a dicing apparatus by means of the ring frame 5, and a thermocompression bonding of one side of a silicon wafer 6 is conducted to the polyimide adhesive layer 4 of the bonding sheet 10. The thermocompression bonding is conducted under the above conditions. Subsequently, the above silicon wafer 6 is cut into IC chips by the use of cutting means such as a dicing saw (refer to FIG. 4). The cutting depth is determined taking into account the thickness of the silicon wafer 6, the polyimide adhesive layer 4, the processing film for polyimide type resin 3 and the dicing saw wear. Thereafter, the bonding sheet 10 is expanded so that the IC chip spacings are enlarged to thereby facilitate the pickup of IC chips, as shown in FIG. 5. The pickup of IC chips enables peeling from the processing film for polyimide type resin 3 the IC chips in the state of having the cut polyimide adhesive layer sticking thereto on their backs. That is, the adhesive strength between the IC chips and the polyimide adhesive layer is greater than that between the polyimide adhesive layer and the processing film for polyimide type resin, so that the IC chips can be peeled in the state of having the polyimide adhesive layer sticking thereto on their one sides from the processing film for polyimide type resin.

Figure 3:
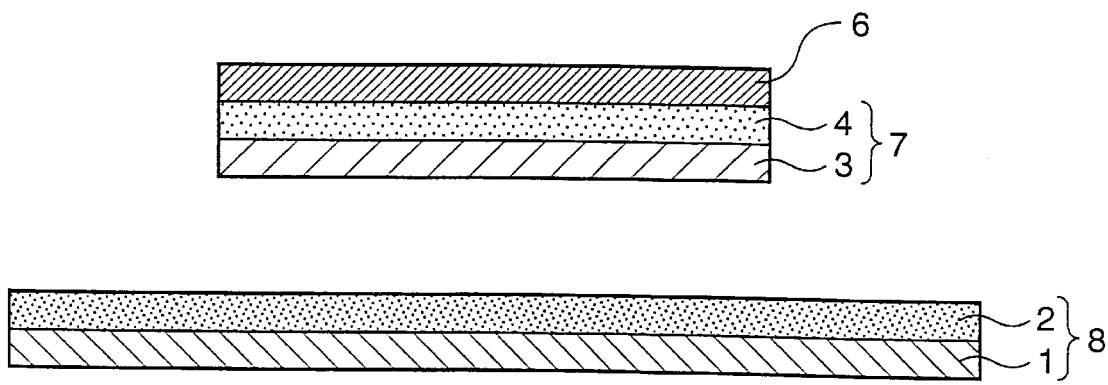
FIG. 3 shows the state of being about to fix the polyimide bonding sheet having a silicon wafer attached thereto by thermocompression bonding on the sheet for expanding process.

In the second process for producing a semiconductor device according to the present invention, a polyimide bonding sheet 7 comprising a heat resistant processing film for polyimide type resin 3 and, formed thereon, a polyimide adhesive layer 4 and a sheet for expanding process 8 comprising a soft film 1 and, formed thereon, a pressure sensitive adhesive layer 2 are separately provided. Subsequently, referring to FIG. 3, a thermocompression bonding of a silicon wafer 6 is conducted to the polyimide adhesive layer 4 of the polyimide bonding sheet 7. The thermocompression bonding is conducted under the above conditions. Thereafter, the processing film for polyimide type resin 3 of the polyimide bonding sheet 7 attached by thermocompression bonding to the silicon wafer 6 is fixed on the sheet for expanding process 8, and these are fixed by means of the ring frame 5. The resultant assembly is subjected to the same dicing, expansion and pickup steps as in the above first process.

The resultant IC chips having the polyimide adhesive layer sticking thereto are placed on a lead frame in a manner such that the polyimide adhesive layer is interposed between the IC chips and the lead frame. Prior to or immediately after the placing of the IC chips, the lead frame is heated at, generally, 100 to 300° C. and, preferably, 150 to 250° C. for a period of, generally, 1 sec 10 to 60 min and, preferably, 1 sec to 1 min. This heating fuses or cures the polyimide type resin with the result that the IC chips can firmly be bonded to the lead frame.

The bonding sheet of the present invention can be utilized in not only the above use but also the bonding of a semiconductor compound, a glass, a ceramic, a metal, etc.

EFFECT OF THE INVENTION

In the present invention, the wafer dicing/bonding sheet including the polyimide adhesive layer can easily be expanded. The present invention provides the wafer dicing/bonding sheet which can be used as a dicing tape at the time of dicing, can be mounted as an adhesive on the back of a wafer, ensures high adhesive strength in the bonding of, for example, the lead frame and is provided with the polyimide adhesive layer exhibiting excellent heat resistance and aging resistance after the die bonding thereof. Further, the present invention enables reducing material loss at the use of the polyimide adhesive and enables forming an adhesive layer with uniform thickness. Moreover, the thermal and mechanical damages which the wafer is likely to suffer from can be avoided at the transfer of the polyimide adhesive layer to the wafer. Still further, the present invention provides the polyimide bonding sheet and processing film for polyimide type resin which can suitably be used in the above wafer bonding sheet and process for producing a semiconductor device. Still further, the present invention provides the process for producing a semiconductor device by which package cracking is hardly occurred.

EXAMPLE

The present invention will further be illustrated below with reference to the following Examples which in no way limit the scope of the invention.

In the following Examples and Comparative Examples, the "expansion ratio", "ratio of package crack", "quantity of scattered chips" and "chip peeling strength" were evaluated in the following manners.

Expansion Ratio

A 4-inch silicon wafer was fixed to the polyimide adhesive surface of a wafer dicing/bonding sheet by a thermocompression bonding (140° C., 2.0 kg/cm$^2$), and a ring frame was fixed on the pressure sensitive adhesive layer of the wafer dicing/bonding sheet. Then, a full cut dicing was performed to a depth of the processing film for polyimide type resin of the wafer dicing/bonding sheet according to the common procedure to thereby effect splitting into 10 mm×10 mm IC chips, and the outside diameter of the split wafer (transverse direction=X, longitudinal direction=Y) was measured.

Thereafter, an expansion was conducted by drawing as much as an expansion length of 17 mm, so that the wafer (IC chip spacing) was expanded. The outside diameter of the expanded wafer was measured, and the ratio of expansion of the outside diameter of the wafer by the expansion was calculated by the following formula:

$$\text{expansion ratio } (\%) = \frac{\text{outside diameter of wafer after expansion}}{\text{outside diameter of wafer before expansion}} \times 100$$

Ratio of Package Crack

Chips were picked up from the wafer dicing/bonding sheet after dicing and mounted on a lead frame. Bonding was conducted and a high pressure sealing was effected with the use of a preselected mold resin (biphenyl type epoxy resin). This resin was cured by heating at 175° C. for 6 hr, so that packages were completed. The packages were allowed to stand still in an 85° C.×85% RH atmosphere for 168 hr. Thereafter, a vapor phase soldering (VPS, duration: 1 min) was conducted at 215° C. thrice, and whether or not the sealing resin cracked was inspected by a scanning acoustic tomography (SAT). The ratio of the number of cracked specimens to the sum of input test specimens was determined and expressed as "ratio of package crack".

Quantity of Scattered Chips

The number of scattered chips (including irregular pieces at peripheral portions) was counted after the dicing into each chip size.

Chip Peeling Strength

After dicing the wafer adhered on the dicing/bonding sheet into each chip size, the sheet for expanding process of the dicing/bonding sheet was fixed on 10 mm-thick glass plate by means of a pressure sensitive adhesive double coated sheet. A vertical hanging jig was fixed to a diced chip surface with the use of an instantaneous adhesive. A nylon loop was fixed to a cross head part of Instron model no. 4204 universal tester (manufactured by Instron Corporation) and interlocked with a hooked part of the above jig. Then, the tester was operated at a cross head speed of 500 mm/min to thereby effect vertical peeling. The maximum of applied force was determined and expressed as "chip peeling strength".

Example 1

A soft polyvinyl chloride film (100 μm thick) being extensible in both the direction of the length and the direction of the width as a soft film was coated with an acrylic pressure sensitive adhesive (solid contents coating thickness: 10 μm) to provide a pressure sensitive adhesive layer, thereby obtaining a sheet for expanding process. Separately, the treated surface of a polyethylene naphthalate film treated with an alkyd release agent (thickness: 25 μm. melting point: 272° C., surface tension: 34 dyn/cm) was coated with a solution of thermoplastic polyimide adhesive in cyclohexanone (coating thickness: 10 μm) and dried (140° C., 3 min), thereby obtaining a polyimide bonding sheet. The polyimide bonding sheet was laminated to the sheet for expanding process in a manner such that the untreated surface of the polyethylene naphthalate film contacted the pressure sensitive adhesive layer. Punching was performed so that the sheet for expanding process and the polyimide bonding sheet were formed into concentric circles of 207 mm and 120 mm in diameter, respectively. Thus, a wafer dicing/bonding sheet was obtained. A silicon wafer was fixed to the bonding sheet by a thermocompression bonding (140° C., 30 sec) and fixed by a ring frame. Then, the dicing, expansion and IC molding were carried out according to the common procedure. In the dicing, no scattering of IC chips occurred.

Thereafter, the expansion ratio, ratio of package crack, quantity of scattered chips and chip peeling strength were measured in the above manners. The results are given in Table 1.

Example 2

The same procedure as in Example 1 was repeated except that an ethylene/vinyl acetate copolymer film (100 μm thick) being extensible in both the direction of the length and the direction of the width was used as the soft film. The results are given in Table 1.

Example 3

The same procedure as in Example 1 was repeated except that a polyethylene naphthalate film treated with a silicone release agent (thickness: 25 μm, melting point: 272° C., surface tension: 30 dyn/cm) was employed in place of the polyethylene naphthalate film treated with an alkyd release agent (thickness: 25 μm, melting point: 272° C., surface tension: 34 dyn/cm). The results are given in Table 1.

Example 4

The same procedure as in Example 1 was repeated except that a polyethylene terephthalate film treated with a silicone release agent (thickness: 25 μm, melting point: 256° C., surface tension: 30 dyn/cm) was employed in place of the polyethylene naphthalate film treated with an alkyd release agent (thickness: 25 μm, melting point: 272° C., surface tension: 34 dyn/cm). The results are given in Table 1.

Example 5

The polyimide bonding sheet employed in Example 1 was punched into a circle of 120 mm in diameter, and a 4-inch silicon wafer was fixed to the above polyimide bonding sheet by a thermocompression bonding (140° C., 2.0 kg/cm$^2$) in a manner such that the back of the silicon wafer contacted the adhesive surface of the polyimide bonding sheet. Thus, a wafer provided with bonding sheet was obtained.

Separately, the sheet for expanding process employed in Example 1 was punched into a circle of 207 mm in diameter and bonded to the polyethylene naphthalate film face of the above polyimide bonding sheet having the silicon wafer fixed thereto.

Thereafter, the resultant laminate was fixed by a ring frame, and the dicing, expansion and IC molding were carried out according to the common procedure. In the dicing, no scattering of IC chips occurred.

Thereafter, the expansion ratio, ratio of package crack, quantity of scattered chips and chip peeling strength were measured in the above manners. The results are given in Table 1.

Comparative Example 1

The treated surface of polyethylene terephthalate film treated with a silicone release agent (trade name: SP PET3811, produced by Lintec Corporation) was coated with a solution of thermoplastic polyimide adhesive in cyclohexanone (coating thickness: 10 μm) and dried (140° C., 2 min). The resultant laminate was punched so that a polyimide bonding sheet having the form of a circle of 120 mm in diameter was obtained. Subsequently, a 4-inch silicon wafer was fixed to the above polyimide bonding sheet by a thermocompression bonding (140° C., 2.0 kg/cm$^2$) in a manner such that the back of the silicon wafer contacted the adhesive surface of the polyimide bonding sheet. Thus, a wafer provided with bonding sheet was obtained.

The polyethylene terephthalate film treated with the release agent was peeled from the above wafer provided with bonding sheet, thereby obtaining an adhesive-coated wafer. This adhesive-coated wafer was adhered on a sheet for expanding process of 207 mm in diameter comprising a soft polyvinyl chloride film (100 μm thick) having one side thereof coated with an acrylic pressure sensitive adhesive (coating thickness: 10 μm) in a manner such that the polyimide adhesive contacted the acrylic pressure sensitive adhesive, thereby fixed by a ring frame. The obtained product was diced and expanded according to the common procedure. In the dicing, no scattering of IC chips occurred. However, all the input test specimens suffered from package cracking.

Comparative Example 2

A soft polyvinyl chloride film (100 μm thick) was coated with a solution of thermoplastic polyimide adhesive in cyclohexanone and dried (140° C., 2 min). In the drying, the soft polyvinyl chloride film suffered from thermal deformation. Even when vacuum drying was performed, the soft polyvinyl chloride film suffered from swelling and deformation. Thus, a wafer dicing/bonding sheet could not be obtained.

TABLE 1

|  | Quantity of scattered chips | | Chip peeling strength | | Expansion ratio (%) | | Ratio of package crack |
|---|---|---|---|---|---|---|---|
|  | 3 mm□ | 10 mm□ | 3 mm□ | 10 mm□ | X | Y | 10 mm□ |
| Ex. 1 | 0 | 0 | 250 | 840 | 105.1 | 105.3 | 0/15 |
| EX. 2 | 0 | 0 | 250 | 840 | 106.4 | 106.5 | 0/15 |
| EX. 3 | 9 | 0 | 180 | 770 | 104.9 | 104.9 | 0/15 |
| Ex. 4 | 6 | 0 | 190 | 810 | 104.8 | 104.9 | 0/15 |
| Ex. 5 | 0 | 0 | 250 | 840 | 105.4 | 105.6 | 0/15 |
| Comp. Ex. 1 | 0 | 0 | 720 | 2800 | 105.6 | 105.6 | 15/15 |
| Comp. Ex. 2 | Sheet could not be obtained. | | | | | | |

What is claimed is:

1. A process for producing a semiconductor device, which comprises the steps of:

conducting a thermocompression bonding of a semiconductor wafer to a polyimide adhesive layer of a wafer dicing/bonding sheet including an expanding process sheet comprising a film and, formed thereon, an adhesive layer, and a polyimide bonding sheet attached to the expanding process sheet, the polyimide bonding sheet comprising a processing film and, formed thereon, a polyimide adhesive layer;

dicing the semiconductor wafer into IC chips;

expanding the wafer dicing/bonding sheet so as to enlarge IC chips spacings;

peeling from the processing film the IC chips having the polyimide adhesive layer sticking thereto on their backs; and placing the IC chips on a lead frame in a manner such that the polyimide adhesive layer is interposed between the IC chips and the lead frame to thereby bond the IC chips to the lead frame.

2. The process as claimed in claim 1, wherein the processing film is made from a resin having a melting point of 230° C. or higher.

3. The process as claimed in claim 2, wherein the processing film is made from a polyethylene naphthalate resin.

4. The process as claimed in claim 1, wherein the processing film has a surface tension of less than 40 dyn/cm.

5. The process as claimed in claim 1, wherein the adhesive layer has a surface area, the process including supporting the surface area by a wafer dicing ring frame having an inside diameter, the polyimide adhesive layer having an outside diameter which is smaller than the inside diameter of the wafer dicing ring frame.

6. A process for producing a semiconductor device, which comprises the steps of:

conducting a thermocompression bonding of a semiconductor wafer to a polyimide adhesive layer of a polyimide bonding sheet, which polyimide bonding sheet comprises a processing film and, formed thereon, the polyimide adhesive layer;

attaching an expanding process sheet comprising a film and, formed thereon, an adhesive layer to the polyimide bonding sheet in a manner such that the adhesive layer contacts an exposed surface of the processing film of the polyimide bonding sheet;

dicing the semiconductor wafer into IC chips;

expanding the expanding process sheet so as to enlarge IC chip spacings;

peeling from the processing film the IC chips having the polyimide adhesive layer sticking thereto on their backs; and placing the IC chips on a lead frame in a manner such that the polyimide adhesive layer is interposed between the IC chips and the lead frame to thereby bond the IC chips to the lead frame.

7. The process as claimed in claim 6, wherein the processing film is made from a resin having a melting point of 230° C. or higher.

8. The process as claimed in claim 6, wherein the processing film has a surface tension of less than 40 dyn/cm.

9. The process as claimed in claim 6, wherein the adhesive layer has a surface area, the process including supporting the surface area by a wafer dicing ring frame having an inside diameter, the polyimide adhesive layer having an outside diameter which is smaller than the inside diameter of the wafer dicing ring frame.

* * * * *

UNITED STATES PATENT AND TRADEMARK OFFICE
CERTIFICATE OF CORRECTION

| | |
|---|---|
| PATENT NO. : | 5,882,956 |
| DATED : | March 16, 1999 |
| INVENTOR(S) : | Norito Umehara et al. |

It is certified that error appears in the above-identified patent and that said Letters Patent is hereby corrected as shown below:

Title Page, under [56] References Cited, U.S. DOCUMENTS, first reference:
   "Shayon" should read --Sheyon--.

Title Page, [56] References Cited, U.S. DOCUMENTS, third reference:
   "Komyama" should read --Komiyama--.

Column 4 Line 57 "especially, dyn/cm" should read --especially, 30 to 40 dyn/cm--.

Column 7 Line 44 after "1 sec" delete --10--.

Column 9 Line 15 after "$\mu$m" delete period and insert comma --,--.

Signed and Sealed this

Fifth Day of October, 1999

Q. TODD DICKINSON

*Attest:*

*Attesting Officer*     Acting Commissioner of Patents and Trademarks